US008841949B2

(12) United States Patent
Willey et al.

(10) Patent No.: US 8,841,949 B2
(45) Date of Patent: *Sep. 23, 2014

(54) MEASUREMENT INITIALIZATION CIRCUITRY

(71) Applicant: Micron Technology, Inc., Boise, ID (US)

(72) Inventors: Aaron Willey, Burlington, VT (US); Yantao Ma, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/102,166

(22) Filed: Dec. 10, 2013

(65) Prior Publication Data

US 2014/0097880 A1  Apr. 10, 2014

Related U.S. Application Data

(63) Continuation of application No. 13/074,945, filed on Mar. 29, 2011, now Pat. No. 8,604,850.

(51) Int. Cl.
H03L 7/06 (2006.01)
G11C 7/22 (2006.01)
H03L 7/08 (2006.01)
H03L 7/081 (2006.01)

(52) U.S. Cl.
CPC ......... H03L 7/08 (2013.01); G11C 7/222 (2013.01); H03L 7/0816 (2013.01)
USPC ............ 327/158; 327/147; 327/159; 327/156

(58) Field of Classification Search
USPC .............. 327/141, 144–163; 331/1/A, 15–17; 375/373–376
See application file for complete search history.

(56) References Cited

U.S. PATENT DOCUMENTS

| 7,215,596 | B2 | 5/2007 | Jeong |
| 7,375,565 | B2 | 5/2008 | Kwak |
| 7,671,648 | B2 | 3/2010 | Kwak |
| 7,728,639 | B2 | 6/2010 | Gomm et al. |
| 7,944,256 | B2 * | 5/2011 | Masuda ................. 327/156 |
| 8,126,041 | B2 * | 2/2012 | Kam et al. ............. 375/226 |
| 8,604,850 | B2 | 12/2013 | Willey et al. |
| 2005/0093593 | A1 * | 5/2005 | Fukuzawa et al. ....... 327/156 |
| 2005/0286672 | A1 * | 12/2005 | Lin et al. .............. 375/376 |
| 2007/0216456 | A1 | 9/2007 | Kook et al. |

(Continued)

OTHER PUBLICATIONS

International search report for PCT/US2012/028198, dated Oct. 16, 2012.

(Continued)

Primary Examiner — Brandon S Cole
(74) Attorney, Agent, or Firm — Dorsey & Whitney LLP

(57) ABSTRACT

Measurement initialization circuitry is described. Propagation of a start signal through a variable delay line may be stopped by either of two stop signals. One stop signal corresponds to a rising edge of a reference clock signal. A second stop signal corresponds to a falling edge of the reference clock signal. The start signal propagation is stopped responsive to the first to arrive of the first and second stop signals. Accordingly, in some examples, start signal propagation through a variable delay line may be stopped responsive to either a rising or falling edge of the reference clock signal.

21 Claims, 8 Drawing Sheets

(56) References Cited

U.S. PATENT DOCUMENTS

| | | |
|---|---|---|
| 2008/0197899 A1 | 8/2008 | Gomm |
| 2009/0033391 A1* | 2/2009 | Vergnes et al. ............... 327/161 |
| 2009/0102527 A1 | 4/2009 | Abe |
| 2009/0175092 A1 | 7/2009 | Cho |
| 2010/0226188 A1 | 9/2010 | Kim et al. |
| 2011/0058437 A1 | 3/2011 | Miyano |
| 2011/0204942 A1* | 8/2011 | Abe et al. ...................... 327/158 |

OTHER PUBLICATIONS

Written Opinion for PCT/US2012/028198, dated Oct. 16, 2012.

* cited by examiner

MEASUREMENT INITIALIZATION CIRCUITRY

CROSS REFERENCE TO RELATED APPLICATIONS

This application is a continuation of U.S. patent application Ser. No. 13/074,945, filed on Mar. 29, 2011. This application is incorporated herein by reference, in its entirety, and for any purpose.

TECHNICAL FIELD

Embodiments of the invention relate generally to semiconductor memory, and particularly, to measurement initialization circuitry which may be used, for example, in delay locked loops.

BACKGROUND

In synchronous integrated circuits, the integrated circuit may be clocked by an external clock signal and perform operations at predetermined times relative to the rising and falling edges of the applied clock signal. Examples of synchronous integrated circuits include synchronous memory devices such as synchronous dynamic random access memories ("SDRAMs"), synchronous static random access memories ("SSRAMs"), and packetized memories like SLDRAMs and RDRAMs, and include other types of integrated circuits as well, such as microprocessors. The timing of signals external to a synchronous memory device may be determined by the external clock signal, and operations within the memory device are typically synchronized to external operations. For example, data output may be placed on a data bus of the memory device in synchronism with the external clock signal, and the memory device may output data at the proper times. To output data at proper timings, an internal clock signal may be developed in response to the external clock signal, and is typically applied to latches contained in the memory device to clock data. The internal clock signal and external clock must be synchronized to ensure the internal clock signal clocks the latches at the proper times to successfully capture the commands. In the present description, "external" refers to signals and operations outside of the memory device, and "internal" refers to signals and operations within the memory device. Moreover, although examples in the present description are directed to synchronous memory devices, the principles described herein are equally applicable to other types of synchronous integrated circuits.

To synchronize external and internal clock signals in modern synchronous memory devices, a number of different approaches have been considered and utilized, including delay locked loops ("DLLs"), as will be appreciated by those skilled in the art. As used herein, the term synchronized includes signals that are coincident and signals that have a desired delay relative to one another. FIG. 1 is a schematic illustration of a conventional DLL circuit 100 for providing an approximate delay that closely matches the phase difference between input and output clock signals. The DLL circuit 100 uses a feedback configuration that operates to feed back a phase difference-related signal to control one or more delay lines, such as a variable delay line 112, for advancing or delaying the timing of one clock signal to "lock" to a second clock signal.

An external clock signal is initially applied to the DLL circuit 100 and received by an input buffer 104 that provides a buffered clock signal DLY_REF to the DLL circuit 100. The DLY_REF signal is delayed relative to the external clock signal due to a propagation delay of the input buffer 104. The DLY_REF signal is then applied to variable delay line 112, which include a number of delay stages that are selected by a shift register 120 to apply a measured delay for adjusting the phase of the DLY_REF signal. The shift register 120 controls adjustments to the variable delay line 112 by providing shift control signals 134 in response to receiving control signals from a phase detector 130. In response to the shift control signals 134, the variable delay line 112 applies a measured delay to adjust the phase of the DLY_REF signal near the desired phase for achieving the phase lock condition. The variable delay line 112 generates an output signal CLK_OUT, whose phase is compared to the DLY_REF signal to determine whether the locking condition has been achieved. The CLK_OUT signal is provided to a model delay circuit 140 that duplicates inherent delays added to the applied external clock signal as it propagates through the delay loop, such as the input buffer 104 plus output path delay that may occur after the DLL. The model delay circuit 140 then provides a feedback signal DLY_FB to the phase detector 130. The phase detector 130 compares the phases of the DLY_REF signal and the DLY_FB signal to generate shift selection signals 132 to the shift register 120 to control the variable delay line 112. The shift selection signal instructs the shift register 120 to increase the delay of the variable delay line 112 when the DLY_FB signal leads the DLY_REF signal, or decrease the delay in the opposite case. The delay may be increased or decreased by adding or subtracting a number of stages used in the variable delay line 112, where the variable delay line 112 includes a number of delay stages. In this manner, the DLL 100 may synchronize an internal clock signal CLK_OUT with an external clock signal.

As was described above, the DLL 100 may take a certain amount of time to achieve a "locked" condition. This time may be shortened if the variable delay line 112 was initially set to a delay which approximates the anticipated needed delay to synchronize the internal and external clock signals. Minimal delay may be preferable for locking purposes due to lower power being consumed. In order to provide this initial delay, some DLL circuits may include a measurement initialization capability. FIG. 2 is a schematic illustration of a portion of a DLL including circuitry for measurement initialization. To highlight the measurement initialization circuitry, not all of the DLL circuitry (such as the phase detector) is shown in FIG. 2.

An external clock signal is provided to an input buffer 201 to generate a ref_clk signal. The ref_clk signal is provided to an input of a multiplexer 203. The multiplexer 203 may select an input corresponding to a control signal MUX received from a controller 210. Initially, the multiplexer 203 may be configured to allow the ref_clk signal to be provided to the variable delay line 205. The variable delay line 205 may be initially set to provide a minimal delay, that is set to minimize the $t_{DLL}$ time shown in FIG. 2, such that minimal delay stages may be used. The variable delay line 205 may be set in this manner responsive to a control signal vdl_cntrl from the controller 210. After the ref_clk signal passes through the variable delay line 205, it is provided to a model delay 212. The model delay 212 may generally model delays outside of the delay loop, such as delays from input buffers, etc. The model delay 212 then provides a signal to a $t_{AC}$ trim block 214. The $t_{AC}$ trim block 214 may generally compensate for access time delays as specified by a particular system. The $t_{AC}$ trim block 214 may then provide a signal to a latch 216, converting the received signal to signal (e.g. an edge or pulse)

a 'Start' signal. The 'Start' signal may be provided to a buffer 218 which may then provide the signal to a second input of the multiplexer 203. The multiplexer may be controlled to then provide the 'Start' signal to the variable delay line 205. In this manner, a 'Start' signal begins propagating through the variable delay line 205.

The ref_clk signal may also be provided directly to the $t_{AC}$ trim block 214. The $t_{AC}$ trim block 214 may then provide the delayed signal to a latch 220, which may convert the ref_clk signal to a signal, referred to as a 'Stop' signal (e.g. edge or pulse). The 'Stop' signal may be provided to a buffer 222 and then provided to latches in the stages of the variable delay line 205. In this manner, the 'Stop' signal may stop (e.g. latch) the 'Start' signal as it propagates through the variable delay line 205. Information regarding the number of stages the 'Start' signal propagated through before receipt of the 'Stop' signal may be provided by the variable delay line 205 in the form of a vdl_meas signal indicating the stage at which the 'Start' signal was latched. The controller 210 may accordingly set the variable delay line 205 to use that number of stages through the vdl_cntl signal. In this manner, the variable delay line 205 may be initialized to a particular number of stages.

During normal operation, the multiplexer 203 is configured to select the ref_clk input to provide to the variable delay line 205. The output of the variable delay line 205 may be provided to an output buffer 225 to generate a synchronized output signal. Although not shown in FIG. 2, recall a phase detector may be used to compare the phase of the ref_clk signal and the clk_fb signal and adjust the delay of the variable delay line 205 during operation. Following lock, a delay between the external clock signal and the synchronized output signal may be $N*t_{CK}$.

FIG. 3 is a schematic illustration of another portion of a DLL including circuitry for implementing the measurement initialization scheme shown in FIG. 2. A flip-flop 302 may receive a high signal (e.g. a logic '1', which may be $V_{CC}$) at its D input and a reference clock signal ref_clk at its clock input. The flip-flop 302 may provide a signal to the serial buffers 304 and 306, modeling delay, as with the model delay 212 of FIG. 2. The output of the buffer 306 may be considered the 'Start' signal and provided to a variable delay line 310. The 'Start' signal from the output of the buffer 306 may also be provided to the D input of a flip-flop 312. The ref_clk signal may also be applied to the clock input of the flip-flop 312. In this manner, the flip-flop 312 may provide a 'Stop' signal at the next rising edge of the ref_clk signal following the receipt of the 'Start' signal. The 'Stop' signal may be provided to the delay line 310 to latch the propagating 'Start' signal.

DETAILED DESCRIPTION

Certain details are set forth below to provide a sufficient understanding of embodiments of the invention. However, it will be clear to one skilled in the art that embodiments of the invention may be practiced without various of these particular details. In some instances, well-known circuits, control signals, timing protocols, and software operations have not been shown in detail in order to avoid unnecessarily obscuring the described embodiments of the invention.

Recall, as described above with reference to FIGS. 2 and 3, an initial number of stages of a variable delay line may be set by measuring the number of stages a 'Start' signal propagates through prior to receipt of a 'Stop' signal. The examples described above generated the 'Stop' signal based on a next rising edge of a reference clock signal following generation of the 'Start' signal. This may generate unnecessary delay in initializing the variable delay line in situations where a falling edge of the clock signal arrives first following the generation of the 'Start' signal.

Figure 1:
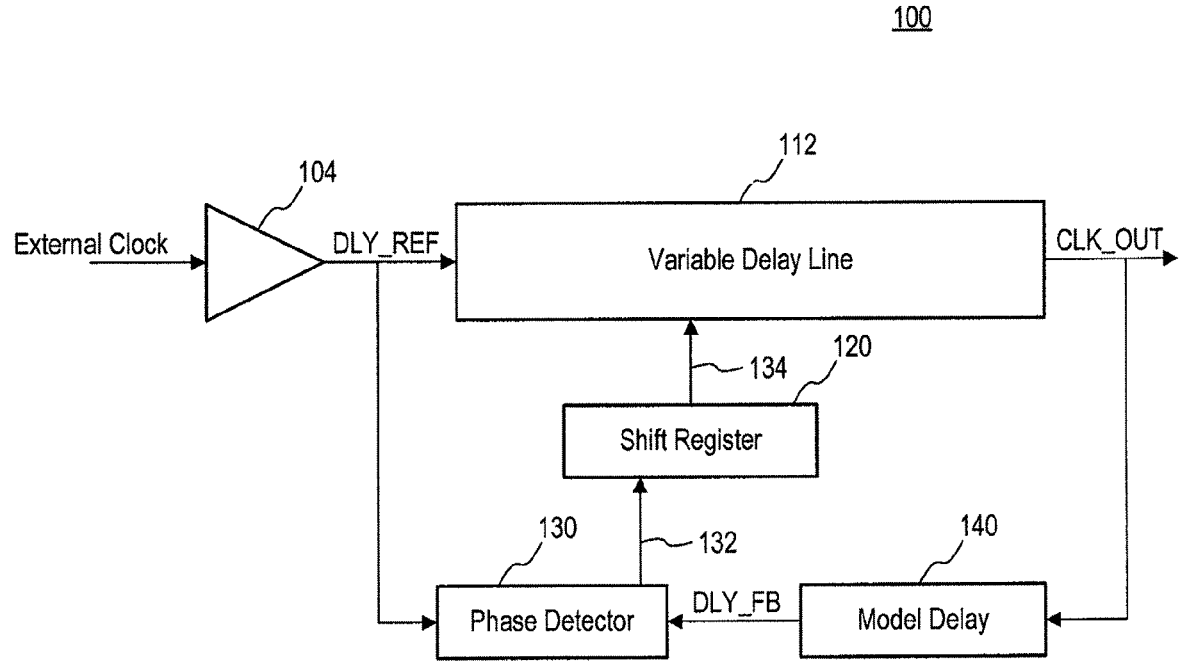
FIG. 1 is a schematic illustration of a conventional DLL circuit.
Figure 2:
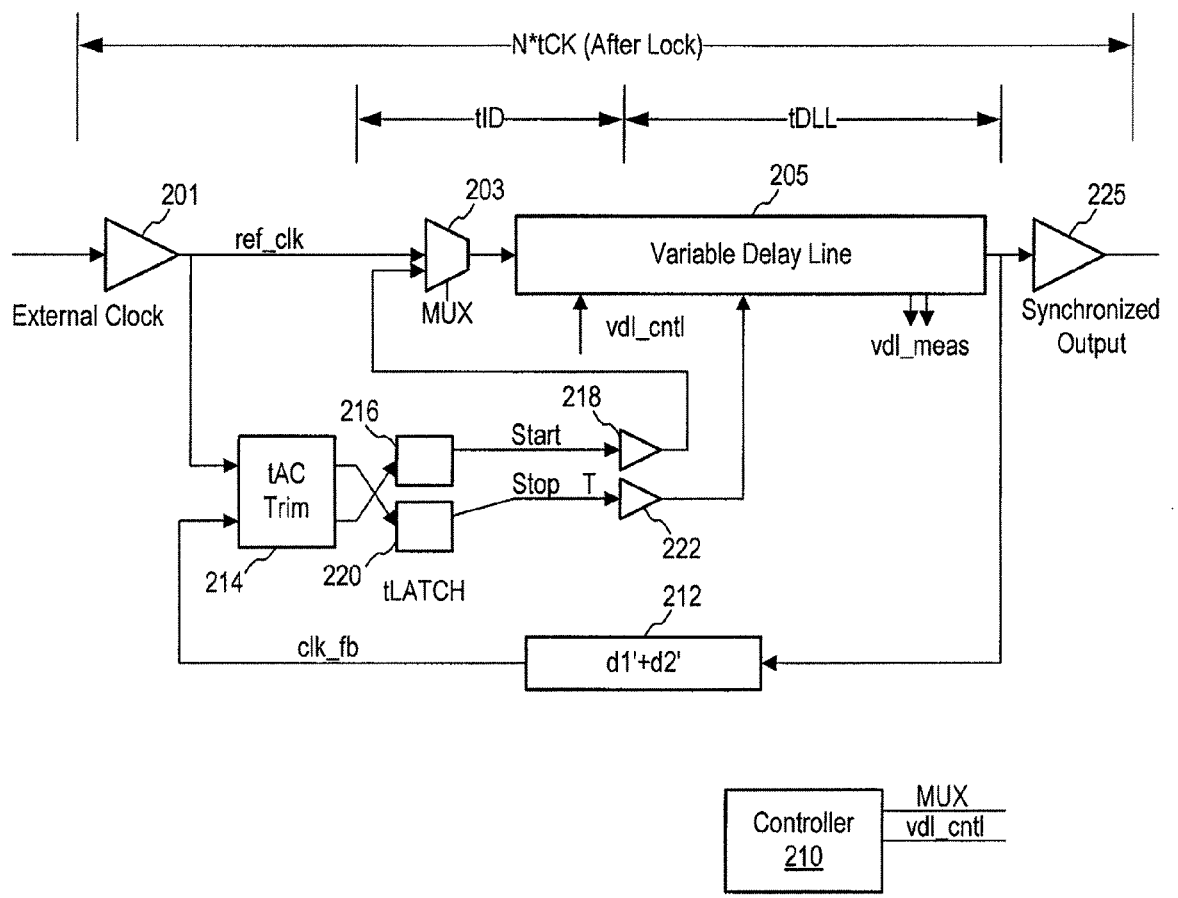
FIG. 2 is a schematic illustration of a portion of a DLL including circuitry for measurement initialization.
Figure 3:
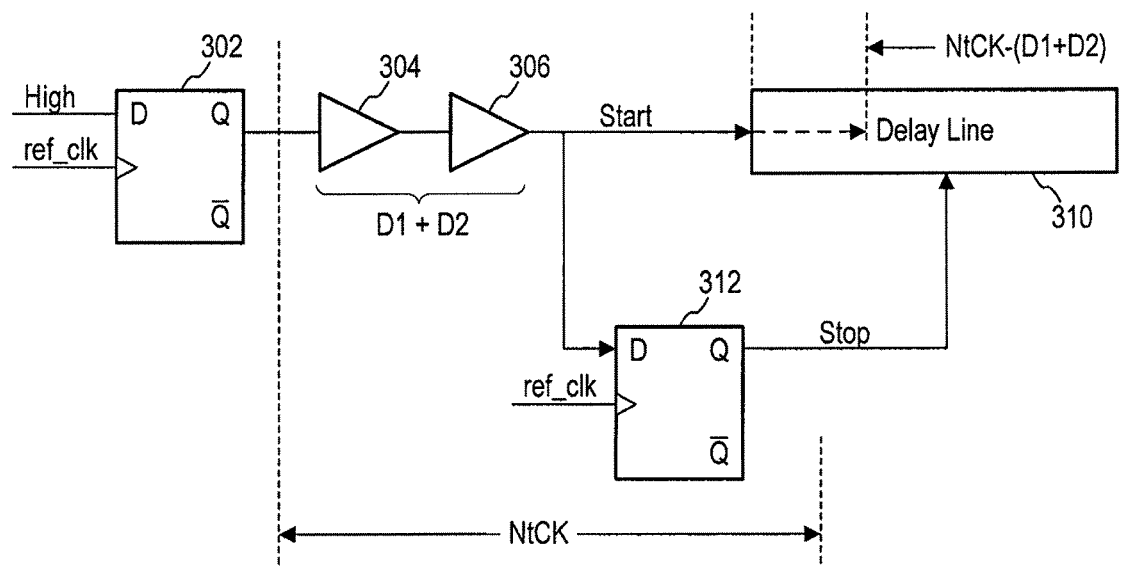
FIG. 3 is a schematic illustration of another portion of a DLL including circuitry for implementing the measurement initialization scheme shown in FIG. 2.
Figure 4:
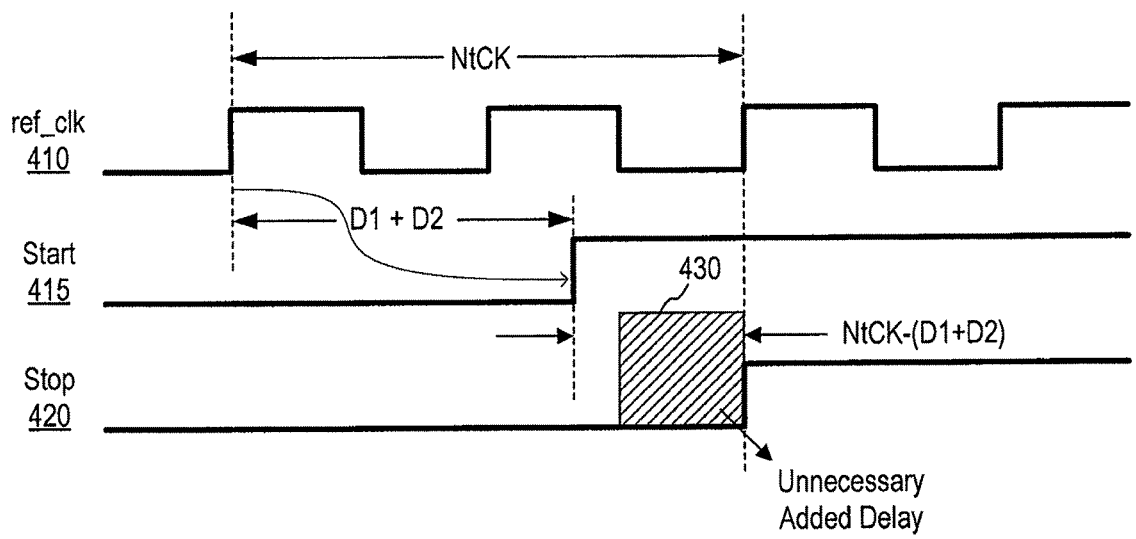
FIG. 4 is an example timing diagram illustrating operation of the measurement in initialization schemes shown in FIGS. 2 and 3.

FIG. 4 is an example timing diagram illustrating operation of the measurement in initialization schemes shown in FIGS. 2 and 3. FIG. 4 illustrates the ref_clk signal 410. At a time D1+D2 of delay following a first rising edge of the ref_clk signal, the start signal 415 transitions high. At a time corresponding to the next rising edge of the ref_clk signal following the high transition of the start signal 415, the stop signal 420 transitions high. The shaded block 430 represents unnecessary added delay beyond the time of the next falling edge of the ref_clk signal following transition of the start signal 415. That is, if the falling edge of the ref_clk signal could be used to initiate a transition of the stop signal 420, the amount of time required to measure an initialization delay through the variable delay line of a DLL may be reduced.

Accordingly, embodiments of the present invention may utilize either a rising or falling edge of a reference clock signal to generate a 'Stop' signal, propagation the stopping of a 'Start' signal in a variable delay line. In many cases, this may save $\frac{1}{2}t_{CK}$ of delay relative to systems utilizing only the rising edge of a clock signal to generate a 'Stop' signal.

Figure 5:
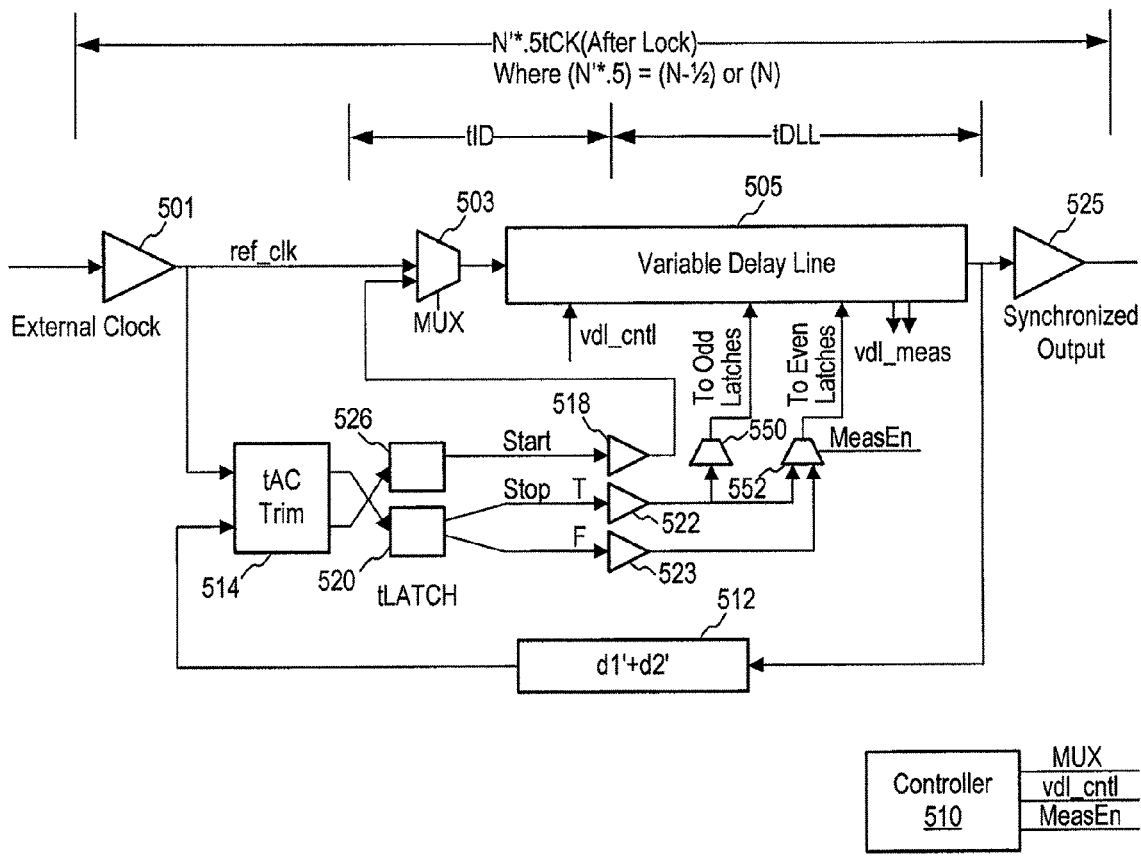
FIG. 5 is a schematic illustration of a DLL including measurement initialization circuitry according to an embodiment of the present invention.

FIG. 5 is a schematic illustration of a DLL including measurement initialization circuitry according to an embodiment of the present invention. The measurement initialization circuitry includes many components analogous to those shown in FIG. 2, which will not be described here again for brevity. For example, input buffer 501, MUX 503, $t_{AC}$ trim block 514, model delay 512, output buffer 525, and latch 526 operate in analogous manner with the corresponding components shown in FIG. 2. The 'Start' signal may be generated by the latch 526. However, the 'Stop' signal may be generated differently in the embodiment of FIG. 5. The latch 520 is configured to receive a delayed ref_clk signal from the $t_{AC}$ trim block 514. The latch 520 generates a signal (e.g. a pulse) both on the rising and the falling edge of the ref_clk signal. The signal generated responsive to the rising edge of the ref_clk signal is provided to a buffer 522. The signal generated responsive to the falling edge of the ref_clk signal is provided to a buffer 523. In this manner, two 'Stop' signals may be generated—one corresponding to a rising edge of the ref_clk signal, and one to the falling edge.

The buffer 522 provides the 'Stop' signal generated responsive to the rising edge of the ref_clk signal to the multiplexers 550 and 552. The buffer 523 provides the 'Stop signal generated responsive to the falling edge of the ref_clk signal to the multiplexer 552. The multiplexer 550 may provide the received 'Stop' signal to the odd latches of the variable delay line 505 during both a measurement initialization mode and a normal mode of operation. The multiplexer 550 may be implemented as a multiplexer or a buffer. However, the multiplexer 552 is configured to receive a control signal, MeasEn, from the controller 510. When the control signal MeasEn indicates measurement initialization mode, the multiplexer 552 may provide the 'Stop' signal generated responsive to the falling edge of the ref_clk signal, e.g. the 'Stop' signal from the buffer 523, to the even latches of the variable delay line 505. When the control signal MeasEn indicates normal mode, however, the multiplexer 552 provides the Stop signal generated responsive to the rising edge to the even latches. Accordingly, during a normal mode of operation the buffer 522 provides a 'shift clock' signal to both the even and odd latches of the variable delay line 505. However, during measurement initialization mode, the odd latches receive the 'Stop' signal from the buffer 522 while the even latches receive the 'Stop' signal from the buffer 523.

Accordingly, either the 'Stop' signal received from the buffer 522, generated responsive to a rising edge of the ref_clk signal, or the 'Stop' signal received from the buffer 523, generated responsive to a falling edge of the ref_clk signal, may stop propagation of a 'Start' signal through the variable delay line 505. In this manner, a ½ $t_{CK}$ time may be saved when the falling edge of the ref_clk signal is the next edge after the 'Start' signal begins propagating through the variable delay line 505. That is, once the 'Start' signal begins propagating through the variable delay line 505, it will stop propagating through the variable delay line 505 responsive to the first to occur of the next rising edge of the ref_clk signal or the next falling edge of the ref_clk signal.

For example, recall the multiplexer 503 may initially provide the ref_clk signal to the variable delay line 505. The variable delay line 505 may then provide a delayed version of the ref_clk signal to the model delay 512. The model delay 512 may provide a further delayed version of the ref_clk signal to the $t_{AC}$ trim block 514. The $t_{AC}$ trim block 514 may provide the delayed version of the ref_clk signal to the latch 526, generating the 'Start' signal, which may be a pulse or an edge, for example. The 'Start' signal is provided to the buffer 518 which in turn provides the signal to the multiplexer 503. The multiplexer 503 may receive a MUX signal from the controller 510 indicating measurement initialization mode, and select the input received from the buffer 518 (the lower shown input in FIG. 5) to provide to the variable delay line 505. Responsive thereto, the 'Start' signal begins propagating through the variable delay line 505.

Recall also the ref_clk signal may be provided to the $t_{AC}$ trim block 514. The delayed ref_clk signal may then be provided to the latch 520, which generates a 'Stop' signal responsive to both the rising and the falling edge of the ref_clk signal received by the latch 520. The signal generated responsive to the rising edge may be provided to the multiplexer 550, while the signal generated responsive to the falling edge may be provided to the multiplexer 552. During measurement initialization mode, the multiplexer 550 may be configured to provide the signal generated responsive to the rising edge to the odd latches of the variable delay line 505 and the multiplexer 552 may be configured to provide the signal generated responsive to the falling edge to the even latches of the variable delay line 505. Whichever signal arrives first after the 'Start' signal begins propagating through the variable delay line 505 may stop the propagation of the variable delay line. A number of stages through which the 'Start' signal propagates, which may be represented by the vdl_meas signal, may be used to set an initial delay amount of the variable delay line during normal operation mode. The vdl_meas signal may indicate whether an even or odd number of stages had been propagated through. As will be described further, this may be used to determine whether or not to employ input clock inversion.

In this manner, the total delay between an external clock and a synchronized output clock may be $(N-½)t_{CK}$ in some examples and may be $Nt_{CK}$ in other examples. Accordingly, the total delay is written in FIG. 5 as $N'*0.5 t_{CK}$ where $N'*0.5 = (N-½)$ or $(N)$.

Figure 6:
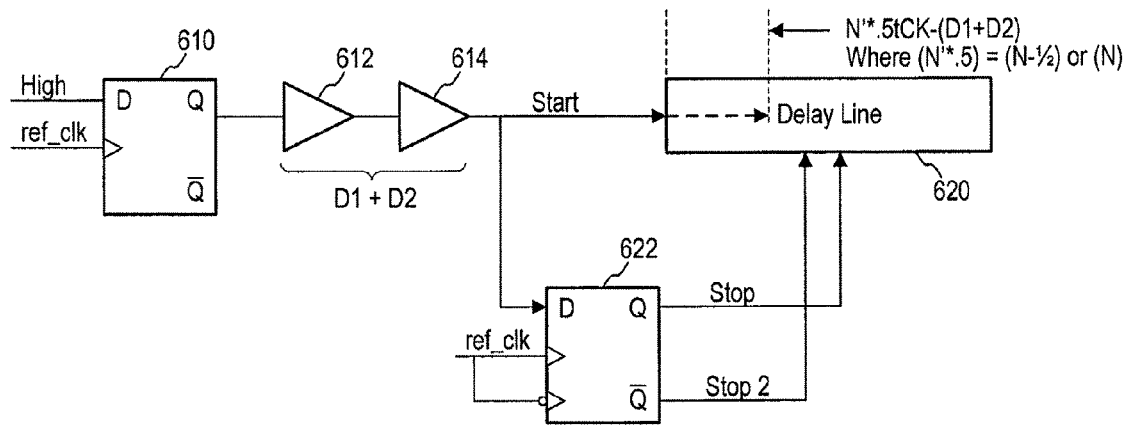
FIG. 6 is a schematic illustration of another portion of a DLL including circuitry for implementing the measurement initialization scheme shown in FIG. 5.

FIG. 6 is a schematic illustration of another portion of a DLL including circuitry for implementing the measurement initialization scheme shown in FIG. 5. A high signal (e.g. a logic '1', which may be Vcc) may be provided to a data input of a flip-flop 610, while a reference clock signal is provided to the clock input of the flip-flop 610. The Q output of the flip-flop 610 may be connected to buffer 612 which in turn is coupled to buffer 614. The buffers 612 and 614 provide a delay of D1+D2. The output of the buffer 614 may be considered the 'Start' signal which may begin propagating through a variable delay line 620. The Start signal may be provided to a data input of 622, and the ref_clk signal provided to the clock input of 622. An inverted ref_clk signal may be provided to another clock input of 622. The Q output of 622 may then provide a 'Stop' signal to the delay line 620. The 'Stop' signal provided by the Q output of 622 may correspond to a rising edge of the ref_clk signal. The $\overline{Q}$ output of 622 may also provide a 'Stop' signal, shown as 'Stop2' in FIG. 6 to the variable delay line 620. The 'Stop2' signal may correspond to a falling edge of the ref_clk signal. In this manner, the first to arrive of the 'Stop' or the 'Stop2' signal may stop propagation of the 'Start' signal through the variable delay line 620.

Figure 7:
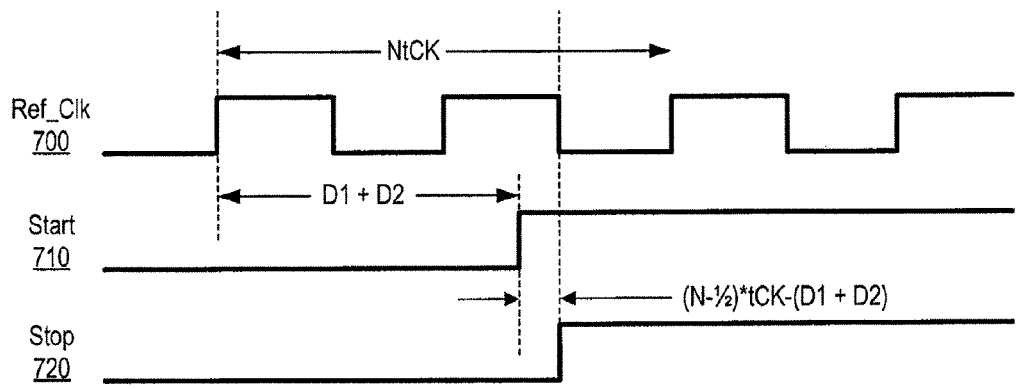
FIG. 7 is an example timing diagram illustrating operation of the measurement in initialization schemes shown in FIGS. 5 and 6.

FIG. 7 is an example timing diagram illustrating operation of the measurement in initialization schemes shown in FIGS. 5 and 6. The ref_clk signal 700 is shown. Following a delay period of D1+D2 after a rising edge of the ref_clk signal 700, the Start signal 710 transitions high. The Stop signal 720 transitions high at the next falling edge of the ref_clk signal 700. The transition of the Stop signal 720 may stop propagation of the Start signal through a variable delay line. Note that, in contrast to the timing diagram in FIG. 4, the ability to generate a Stop signal transition responsive to a falling edge of the ref_clk signal has saved ½ a ref_clk period of time in propagating the Start signal through the variable delay line.

As has been described above, embodiments of the present invention may include measurement initialization circuitry configured to stop propagation of a 'Start' signal through a variable delay line at either a rising or a falling edge of a reference clock signal. Embodiments of the present invention may further utilize information about the propagation of the 'Start' signal in deciding whether or not to invert a clock signal used in a DLL. In some examples, the identification of which 'Stop' signal stopped the propagation of the 'Start' signal may be used to decide when to utilize clock inversion.

Figure 8:
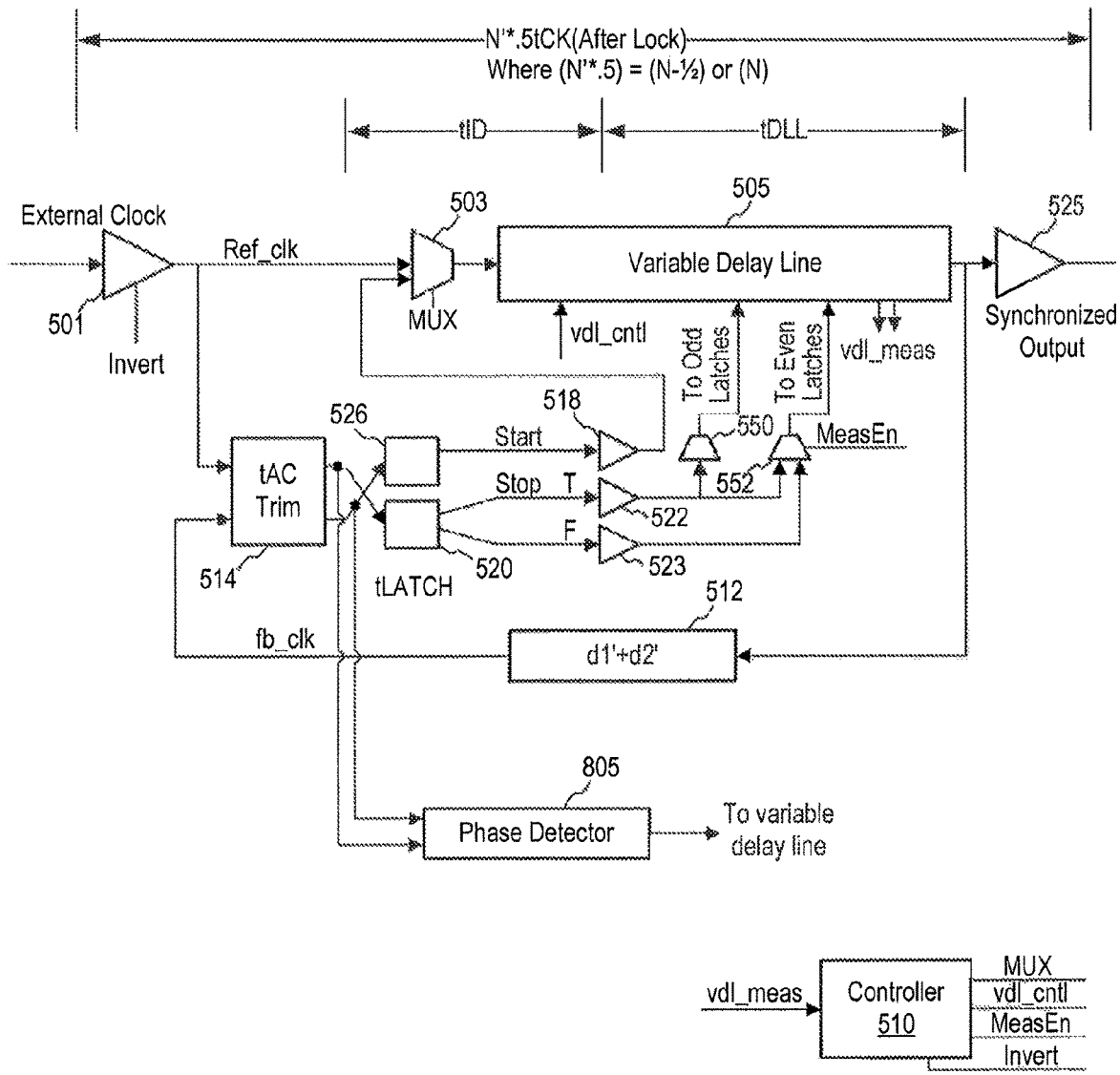
FIG. 8 is a schematic illustration of a portion of DLL circuitry including circuitry utilized to determine clock inversion in accordance with embodiments of the present invention.

FIG. 8 is a schematic illustration of a portion of DLL circuitry including circuitry utilized to determine clock inversion in accordance with embodiments of the present invention. The measurement initialization circuitry shown in FIG.

8 is the same as that shown in FIG. 5, with the same reference numbers used. Those common elements will not be described here again for brevity. Recall, however, that following a measurement initialization mode, a vdl_meas signal from the variable delay line 505 may indicate how far the 'Start' signal propagated through the variable delay line 505 during measurement initialization. The 'Start' signal may be stopped responsive to a 'Stop' signal generated using either a rising or a falling edge of a ref_clk signal. The vdl_meas signal may be indicative of which 'Stop' signal stopped the propagation.

In some examples, a DLL may be able to achieve a faster locked condition if either a ref_clk signal or a feedback clock signal are inverted prior to comparison by a phase detector. Examples of the present invention may make a determination about whether to invert a ref_clk signal or a feedback clock signal based on information obtained during the measurement initialization mode. Referring to FIG. 8, a phase detector 805 is shown which, during normal operation is configured to receive a ref_clk signal from the buffer 501 and a fb_clk signal from the model delay block 512 (after TACtrim block). The phase detector 805 may then compare the phase of the ref_clk and fb_clk signals and provide a phase-dependent output signal to the variable delay line 505 to increase or decrease the delay of the variable delay line.

The vdl_meas signal corresponding to a number of stages through which the 'Start' signal propagated during measurement initialization mode may be provided to the controller 510. The controller 510 may generate an Invert signal based on the vdl_meas signal. In particular, if the vdl_meas signal indicates that the 'Start' signal was latched on a falling edge of the ref_clk signal, for example the 'Start' signal was latched by an even latch of the variable delay line 505. That is, if the 'Stop' signal generated in accordance with the falling edge of the ref_clk signal and provided to the even latches of the variable delay line 505 through the multiplexer 552 latched the 'Start' signal, that may indicate that the DLL may be able to lock faster during normal mode if a clock signal was inverted prior to phase detection. Accordingly, the controller 510 may generate an Invert signal causing a clock signal to be inverted prior to phase detection. This may be implemented in any of a variety of ways, including inverting the ref_clk signal before or after it traverses the variable delay line. In one example, the Invert signal may be provided to the input buffer 501 to cause the input buffer to serve as an inverting buffer and provide an inverted ref_clk signal to the phase detector 805. In another example, the Invert signal may be provided to the multiplexer 503 to cause the multiplexer 503 to act as an inverting multiplexer and pass an inverted ref_clk signal to the variable delay line 505. Other locations for inversion are possible, but note that the inversion decision may be made based on a location of latching the 'Start' signal. That is, an input clock may be inverted at the input buffer, before entering the delay line, or after traversing the delay line but before input to the phase detector.

Figure 9:
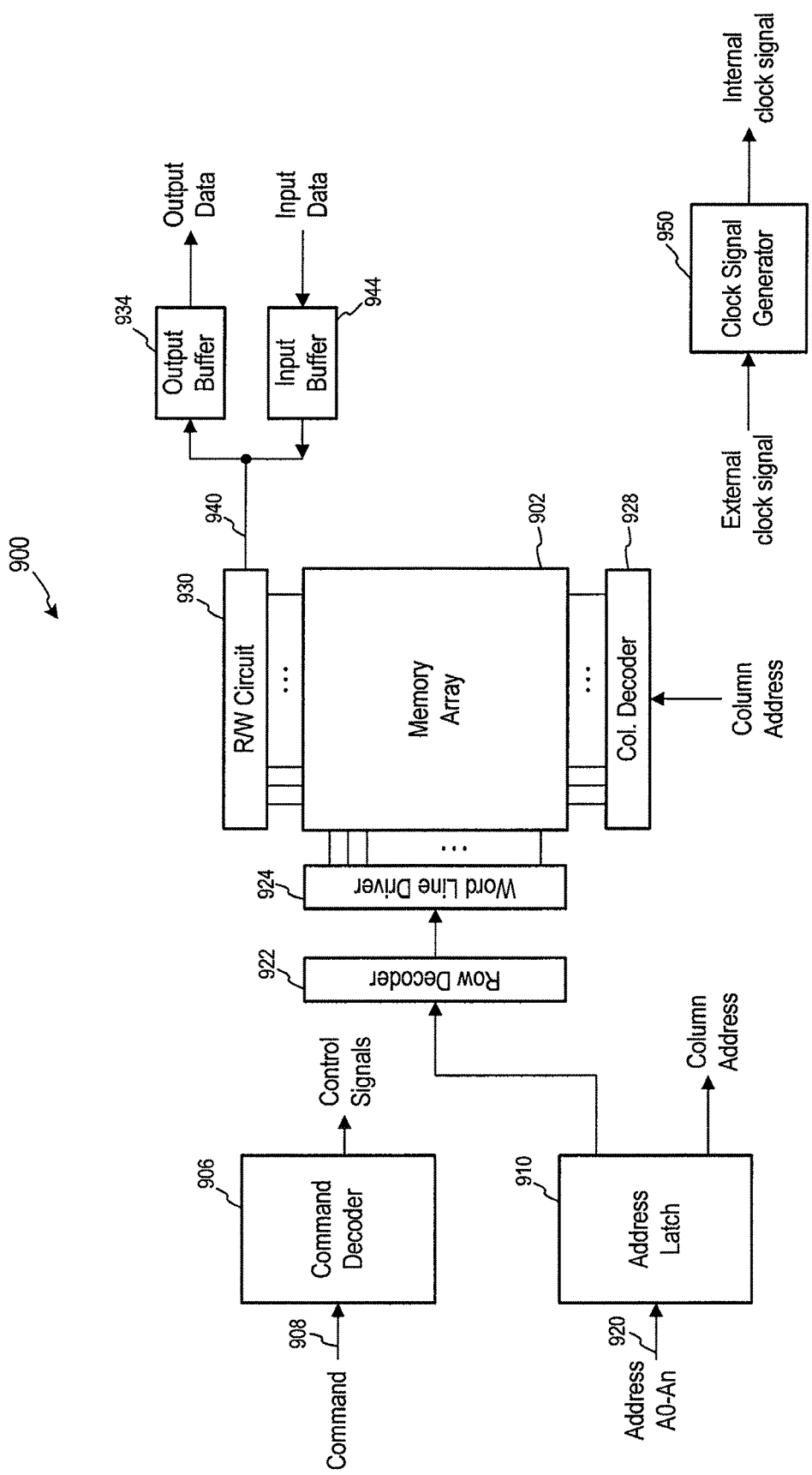
FIG. 9 is a schematic illustration of a portion of a memory according to an embodiment of the present invention.

FIG. 9 is a schematic illustration of a portion of a memory 900 according to an embodiment of the present invention. The memory 900 includes an array 902 of memory cells, which may be, for example, DRAM memory cells, SRAM memory cells, flash memory cells, or some other type of memory cells. The memory system 900 includes a command decoder 906 that receives memory commands through a command bus 908 and generates corresponding control signals within the memory system 900 to carry out various memory operations. The command decoder 906 responds to memory commands applied to the command bus 908 to perform various operations on the memory array 902. For example, the command decoder 906 is used to generate internal control signals to read data from and write data to the memory array 902. Row and column address signals are applied to the memory system 900 through an address bus 920 and provided to an address latch 910. The address latch then outputs a separate column address and a separate row address.

The row and column addresses are provided by the address latch 910 to a row address decoder 922 and a column address decoder 928, respectively. The column address decoder 928 selects bit lines extending through the array 902 corresponding to respective column addresses. The row address decoder 922 is connected to word line driver 924 that activates respective rows of memory cells in the array 902 corresponding to received row addresses. The selected data line (e.g., a bit line or bit lines) corresponding to a received column address are coupled to a read/write circuitry 930 to provide read data to a data output buffer 934 via an input-output data bus 940. Write data are applied to the memory array 902 through a data input buffer 944 and the memory array read/write circuitry 930.

A clock signal generator 950 is configured to receive an external clock signal and generate a synchronized internal clock signal in accordance with embodiments of the present invention. The clock signal generator 950 may include, for example, a DLL including a portion of the DLL shown in FIGS. 5, 6, and/or 8. The clock signal generator 950 may receive an external clock signal applied to the memory system 900 and may generate a synchronized internal clock signal which may be supplied to the command decoder 906, address latch 910, and/or input buffer 944 to facilitate the latching of command, address, and data signals in accordance with the external clock.

Memory systems in accordance with embodiments of the present invention may be used in any of a variety of electronic devices including, but not limited to, computing systems, electronic storage systems, cameras, phones, wireless devices, displays, chip sets, set top boxes, or gaming systems.

From the foregoing it will be appreciated that, although specific embodiments of the invention have been described herein for purposes of illustration, various modifications may be made without deviating from the spirit and scope of the invention.

What is claimed is:

1. An apparatus, comprising:
  a variable delay line configured to receive a start signal at an input and propagate the start signal through the variable delay line, wherein the variable delay line is further configured to receive a first stop signal that is provided responsive to a first rising edge of a reference clock signal following receipt of the start signal, receive a second stop signal that is provided responsive to a first falling edge of the reference clock signal following receipt of the start signal, and stop the propagation of the start signal responsive to receipt of a first of either the first or second signal stop signals.

2. The apparatus of claim 1, wherein the variable delay line is further configured to:
  generate a measurement signal indicative of a number of delay stages of the variable delay line through which the start signal propagated before the receipt of a first of either the first or second stop signals.

3. The apparatus of claim 1, wherein the variable delay line includes odd and even latches.

4. The apparatus of claim 3, wherein the odd latches are configured to receive the first stop signal and wherein the even latches are configured to receive the second stop signal.

5. The apparatus of claim 3, wherein the variable delay line is further configured to generate a measurement signal indicative of whether the start signal was stopped by one of the odd latches or one of the even latches.

6. The apparatus of claim 1, further comprising a multiplexer coupled to the variable delay line and configured to selectively provide a reference clock signal or a delayed reference clock signal.

7. The apparatus of claim 6, wherein the multiplexer comprises au inverting multiplexer and is configured to provide the variable delay line with an inverted reference clock signal.

8. A method comprising:
receiving a start signal at a variable delay line, wherein the start signal is propagated through the variable delay line;
receiving, a first stop signal at the variable delay line, wherein the first stop signal is provided responsive to a first rising edge of a reference clock signal following receipt of the start signal at the variable delay line;
receiving a second stop signal at the variable delay hue, wherein the second stop signal is provided responsive to a falling edge of the reference clock signal following receipt of the start signal at the variable delay line; and
stopping propagation of the start signal along the variable delay line responsive to receipt of a first of the first or second stop signals.

9. The method of claim 8, further comprising adjusting a delay provided to the start signal by the variable delay line, wherein the variable delay line comprises a number of delay stages.

10. The method of claim 9, wherein adjusting the delay provided by the variable delay line further comprises adding or subtracting a number of delay stages used in the variable delay line.

11. The method of claim 9, further comprising outputting an internal clock signal from the variable delay line.

12. The method of claim 10, further comprising synchronizing the internal clock signal with an external clock signal by adjusting a delay provided by the variable delay line.

13. A method comprising:
activating a measurement initialization mode;
generating a measurement signal indicative of a number of delay stages in a variable delay line through which a start signal has propagated before a stop signal has been received;
setting an initial delay amount of the variable delay line for the device during a normal operation mode, wherein the initial delay amount is based, at least in part, on the measurement signal; and
determining whether to generate an invert signal based on the measurement signal during the normal operation mode.

14. The method of claim 13, further comprising generating an inverted reference clock signal by applying the invert signal to an input reference clock signal.

15. The method of claim 14, wherein the invert signal is applied before detecting the phase difference between the input reference clock signal and a feedback clock signal.

16. The method of claim 14, wherein the invert signal is applied to the input reference clock signal before the input reference clock signal traverses the variable delay line.

17. The method of claim 14, wherein the invert signal is applied to the input reference clock signal after the input reference dock signal traverses the variable delay line.

18. The method of claim 13, wherein the invert signal is provided to an input buffer.

19. The method of claim 18, wherein the input buffer serves as an inverting buffer and provides a phase detector with an inverted input reference clock signal.

20. The method of claim 13, wherein the measurement signal is further indicative of whether the stop signal is based on a rising edge of a reference clock signal or a falling edge of a reference clock signal.

21. The method of claim 13, wherein determining whether to apply the invert signal to the input reference clock signal is further based on whether the measurement signal is even or odd.

* * * * *

UNITED STATES PATENT AND TRADEMARK OFFICE
CERTIFICATE OF CORRECTION

PATENT NO.        : 8,841,949 B2                                         Page 1 of 1
APPLICATION NO.   : 14/102166
DATED             : September 23, 2014
INVENTOR(S)       : Aaron Willey et al.

It is certified that error appears in the above-identified patent and that said Letters Patent is hereby corrected as shown below:

In the Claims

In column 8, line 54, in Claim 1, after "second" delete "signal".
In column 9, line 8, in Claim 7, delete "au" and insert -- an --, therefor.
In column 9, line 13, in Claim 8, delete "receiving," and insert -- receiving --, therefor.
In column 9, line 18, in Claim 8, delete "hue," and insert -- line, --, therefor.
In column 10, line 24, in Claim 17, delete "dock" and insert -- clock --, therefor.

Signed and Sealed this
Twenty-third Day of December, 2014

Michelle K. Lee
*Deputy Director of the United States Patent and Trademark Office*